US012602574B2

(12) United States Patent
Harnack et al.

(10) Patent No.: US 12,602,574 B2
(45) Date of Patent: Apr. 14, 2026

(54) NETWORK COMPRISING A PLURALITY OF OSCILLATORS

(71) Applicant: INTERNATIONAL BUSINESS MACHINES CORPORATION, Armonk, NY (US)

(72) Inventors: Nele Harnack, Horgen (CH); Bernd W. Gotsmann, Horgen (CH); Siegfried Friedrich Karg, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 973 days.

(21) Appl. No.: 17/842,512

(22) Filed: Jun. 16, 2022

(65) Prior Publication Data

US 2023/0409888 A1     Dec. 21, 2023

(51) Int. Cl.
| | |
|---|---|
| *G06N 3/049* | (2023.01) |
| *G06N 3/063* | (2023.01) |
| *G06N 3/065* | (2023.01) |
| *H03L 7/00* | (2006.01) |

(52) U.S. Cl.
CPC ............. *G06N 3/063* (2013.01); *G06N 3/049* (2013.01); *G06N 3/065* (2023.01); *H03L 7/00* (2013.01)

(58) Field of Classification Search
CPC ........ G06N 3/04; G06N 3/045; G06N 3/0464; G06N 3/049; G06N 3/06; G06N 3/063; G06N 3/065; H03L 7/00
See application file for complete search history.

(56) References Cited

U.S. PATENT DOCUMENTS

| | | | |
|---|---|---|---|
| 7,280,989 B1 | 10/2007 | Hoppensteadt et al. | |
| 11,164,068 B1 | 11/2021 | Karg et al. | |
| 11,861,488 B1 * | 1/2024 | Yi | G06N 3/049 |
| 2013/0335148 A1 * | 12/2013 | Kousai | H03L 1/027 331/2 |
| 2019/0122095 A1 * | 4/2019 | Karg | G06V 10/82 |
| 2020/0074268 A1 * | 3/2020 | Nikonov | H03K 3/0315 |
| 2020/0160145 A1 | 5/2020 | Nikonov et al. | |
| 2022/0004876 A1 | 1/2022 | Karg et al. | |

FOREIGN PATENT DOCUMENTS

| | | |
|---|---|---|
| CN | 112673383 A | 4/2021 |
| CN | 119301867 A | 1/2025 |
| DE | 112023002662 T5 | 4/2025 |
| GB | 2634672 A | 4/2025 |

(Continued)

OTHER PUBLICATIONS

Qin et al., "Phase-amplitude coupling in neuronal oscillator networks," Physical Review Research 3, 023218 (2021), Published by the American Physical Society under the terms of the Creative Commons Attribution 4.0 International license, 2021, 8 pages, DOI: 10.1103/PhysRevResearch.3.023218.

(Continued)

*Primary Examiner* — Levi Gannon
(74) *Attorney, Agent, or Firm* — Seed Intellectual Property Law Group LLP

(57) ABSTRACT

A network comprises a plurality of oscillators. The network is configured to control the phase of the plurality of oscillators by thermal coupling through a thermal link.

20 Claims, 10 Drawing Sheets

(56) References Cited

FOREIGN PATENT DOCUMENTS

RU          2663546 C1      8/2018
WO      2023/242638 A1    12/2023

OTHER PUBLICATIONS

Velichko et al., "Method of increasing the information capacity of associative memory of oscillator neural networks using high-order synchronization effect," Petrozavodsk State University, Petrozavodsk, 185910, Russia, Printed Jun. 13, 2022, 18 pages, https://arxiv.org/ftp/arxiv/papers/1805/1805.08737.pdf.

Hauptmann et al., "Demand-controlled desynchronization of oscillatory networks by means of a multisite delayed feedback stimulation," Springer-Verlag, Comput Visual Sci (2007) 10:71-78, Published Online Dec. 20, 2006, 8 pages, DOI 10.1007/s00791-006-0034-9.

Velichko et al., "Switching Dynamics of Single and Coupled VO2-BASED Oscillators as Elements of Neural Networks," Department of Physics and Technology, Petrozavodsk State University, Russia, Printed Jun. 13, 2022, 33 pages, https://arxiv.org/ftp/arxiv/papers/2001/2001.01854.pdf.

Velichko et al., "Modeling of thermal coupling in VO2-based oscillatory neural networks," Elsevier, Solid-State Electronics, vol. 139, Jan. 2018, pp. 8-14, https://doi.org/10.1016/j.sse.2017.09.014 (Abstract Only).

Shukla et al., "Synchronized charge oscillations in correlated electron systems," Scientific Reports, Published May 14, 2014, 6 pages, DOI: 10.1038/srep04964.

Velichko et al., "Thermal coupling and effect of subharmonic synchronization in a system of two VO2 based oscillators," Solid-State Electronics, Petrozavodsk State University, Petrozavodsk, 185910, Russia, Printed Jun. 13, 2022, 24 pages.

Velichko et al., "A Model of an Oscillatory Neural Network with Multilevel Neurons for Pattern Recognition and Computing," MDPI, Electronics, 2019, 26 pages.

International Search Report, International Application No. PCT/IB2023/053114, Aug. 10, 2023, 6 pgs.

Unknown, "Hardware for AI", Retrieved from: https://web.archive.org/web/20180829173926/https://www.research.ibm.com/artificial-intelligence/hardware/#focus-areas, Retrieved on: Aug. 29, 2018, 5 pages.

* cited by examiner

500

800

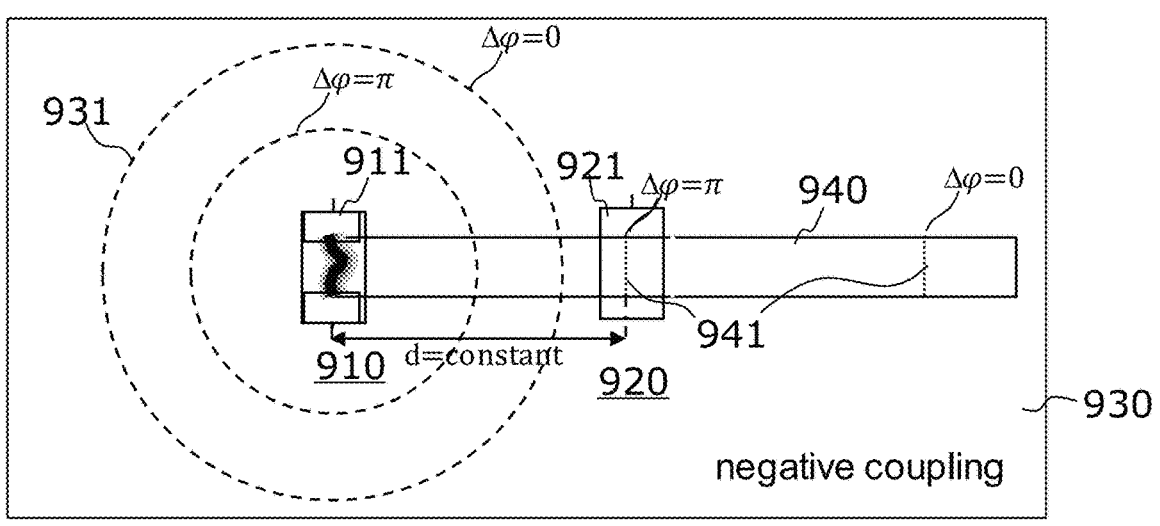
FIG. 9a
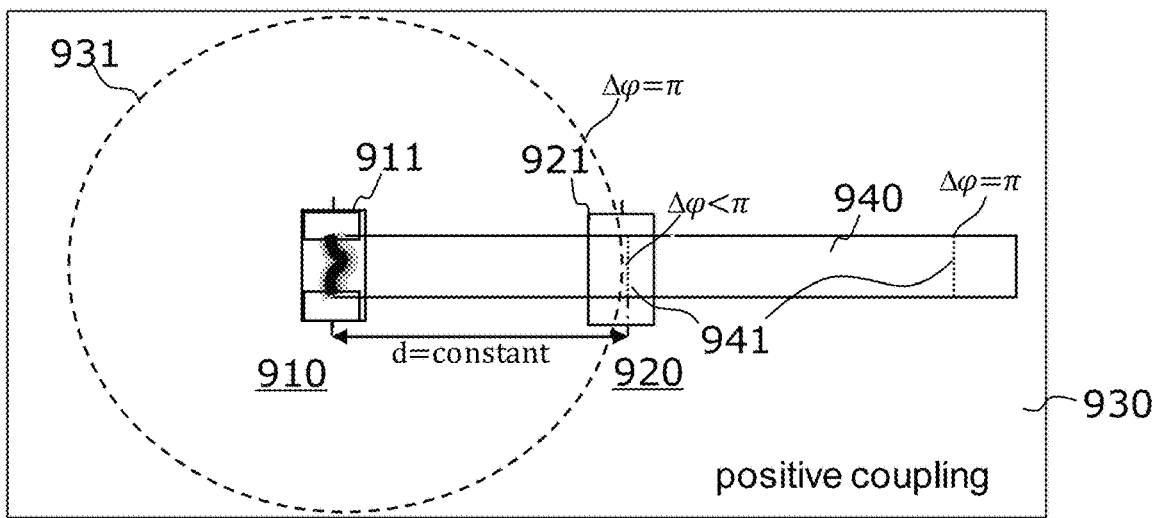
FIG. 9b
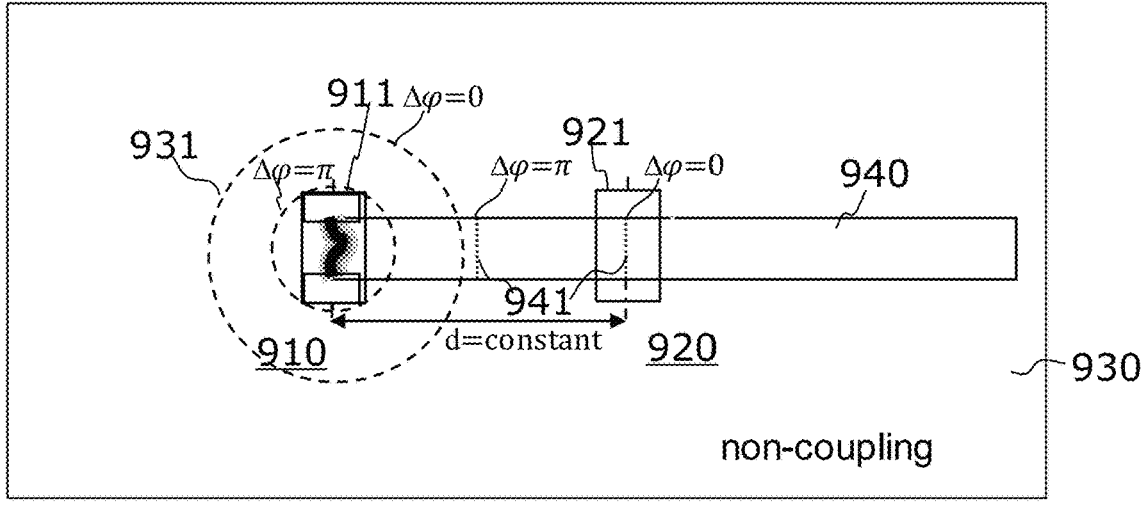
900                        FIG. 9c 1010: Start 1020: Obtain coupling mode 1030: Adapt frequency 1040: Control phase of the oscillators by thermal coupling

1000

NETWORK COMPRISING A PLURALITY OF OSCILLATORS

STATEMENT REGARDING FEDERALLY SPONSORED RESEARCH OR DEVELOPMENT

The project leading to this application has received funding from the European Union's Horizon 2020 research and innovation programme under the Marie Sklodowska-Curie grant agreement No. 861153.

BACKGROUND

The present invention relates generally to a plurality of oscillators.

SUMMARY

According to embodiments, disclosed are a network, a method, and computer program product.

According to embodiments, the invention is embodied as a network comprising a plurality of oscillators. The network is configured to control the phase of the plurality of oscillators by thermal coupling through a thermal link.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 9a to 9c illustrates a network configured to perform an adaptive thermal coupling, wherein FIG. 9a shows a negative coupling;

FIG. 9b shows a positive coupling;

FIG. 9c shows a non-coupling; and

Figure 1:
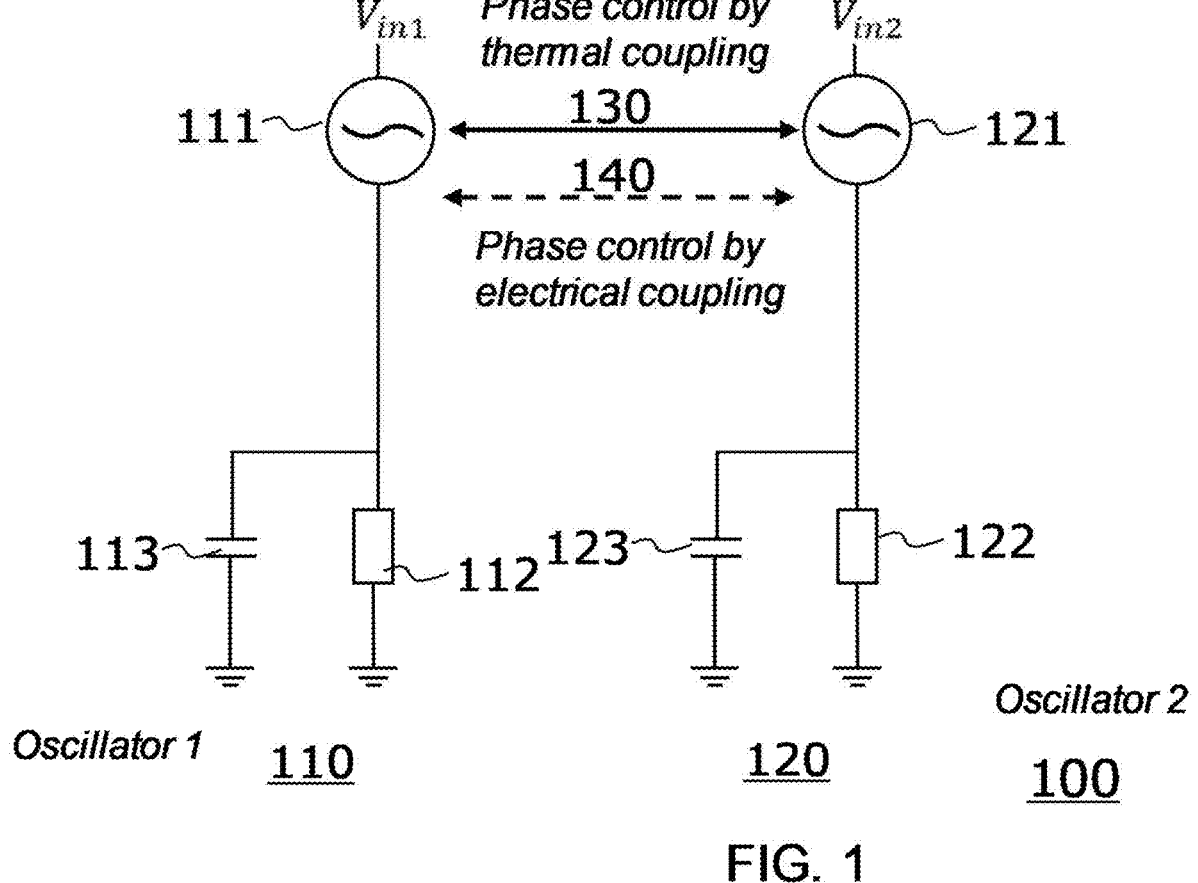
FIG. 1 shows a network according to an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention relates generally to a plurality of oscillators.

Such networks may be embodied as oscillatory neural networks (ONNs) and may be used as hardware implementations of neuromorphic computing. By using oscillatory neural networks, neural networks may be formed in which the information is encoded in the frequency or phase of oscillators. Coupling elements between individual oscillators may be used for signal processing resembling synaptic function.

Such a network of coupled oscillators can perform classification as well as optimization tasks and can be used as a hardware accelerator for first layer filters in convolutional neural networks.

An embodiment uses relaxation oscillators of $VO_2$ resistors.

Oscillatory neural networks may provide advantages in terms of robustness, speed and power efficiency and may be used in particular as input filters for feature detection in image recognition.

Accordingly, there is a need for advanced solutions for such networks.

According to an aspect, the invention is embodied as a network comprising a plurality of oscillators. The network is configured to control the phase of the plurality of oscillators by thermal coupling through a thermal link.

Such a network may provide advantages in terms of energy efficiency as the heat dissipation of elements of the oscillators is used for the control of the phases.

Furthermore, such a network may provide advantages in terms of area efficiency and ease of fabrication as the thermal coupling may be implemented without additional circuitry such as coupling capacitors and coupling inductors. In particular, electrical capacitors require significantly more space than arranging a thermal coupling.

According to embodiments, thermal links for phase control may enable faster and denser oscillating networks with lower power consumption and higher operation speed.

According to embodiments, the thermal coupling comprises antiphase coupling. According to embodiments, the thermal coupling comprises in-phase coupling.

Such networks with positive and negative thermal coupling may facilitate a wide range of applications.

According to embodiments, the network comprises a plurality of electrical links for electrically coupling the plurality of oscillators.

According to embodiments, the network may be a neural network and the plurality of oscillators form an oscillating neural network. The neural network may be in particular a hardware implementation of an artificial neural network.

According to embodiments, the oscillators are embodied as relaxation oscillators. Each oscillator of the plurality of oscillators may comprises a self-heating solid-state phase change device, the solid-state phase change device comprising a phase change material having a first phase-state and a second phase state. The first phase-state may be a low resistance state and the second phase-state a high resistance state. The first phase state may be in particular a metallic state and the second phase state an insulating state.

Such kind of relaxation oscillators facilitate a dense integration of the network.

According to embodiments, the plurality of oscillators comprises a first oscillator comprising a first serial arrangement of a first self-heating phase change device and a first serial resistor and a second oscillator comprising a second serial arrangement of a second self-heating phase change device and a second serial resistor. The first serial resistor may be thermally coupled to the second self-heating phase change device, thereby achieving an unidirectional thermal coupling between the first oscillator and the second oscillator.

According to embodiments, the serial resistor may be implemented as transistor or memristor or any resistive element. According to embodiments, the arrangement may comprise in addition to the thermal link an electrical coupling element (memristor).

Such a network with unidirectional coupling offers advanced applications with enhanced flexibility.

According to embodiments, the network is configured to perform an adaptive thermal coupling between two or more oscillators of the plurality of oscillators by adapting the oscillation frequency of one or more oscillators of the plurality of oscillators, thereby changing a thermal coupling mode. According to embodiments, the thermal coupling mode may comprise bidirectional, unidirectional and/or non-coupling.

Such a network with adaptive thermal coupling offers advanced applications with enhanced flexibility.

According to embodiments, one or more oscillators of the plurality of oscillators comprise two or more tunable resistors, wherein only one of the two or more tunable resistors is thermally coupled to another oscillator of the plurality of oscillators. This allows further applications. In particular, it may be achieved that the overall resistance of the tunable resistors is kept constant and hence the electrical properties of the network or circuit are not changed, while nevertheless the coupling between the oscillators may be tuned.

According to embodiments, a method for running a network comprising a plurality of oscillators. The methods comprise steps of controlling the phase of the plurality of oscillators by thermal coupling through a thermal link.

According to embodiments, a computer program product for operating a network, the network comprising a plurality of oscillators and a plurality of thermal links. The computer program product comprises a computer readable storage medium having program instructions embodied therewith, the program instructions executable by the network to perform a method comprising controlling the phase of the plurality of oscillators by thermal coupling through the thermal links.

Embodiments of the invention will be described in more detail below, by way of illustrative and non-limiting examples, with reference to the accompanying drawings.

In reference to FIGS. 1-10, some general aspects and terms of embodiments of the invention are described.

A thermal wave is the temporally varying temperature field around a heating element with a periodically varying temperature.

The thermal wave changes sign at about a distance of around 2,356η, the normalized distance, wherein $$\eta = \sqrt{\frac{2\alpha}{\omega}}$$

In the above equation α denotes the thermal diffusivity of the respective material through which the thermal wave propagates, e.g. the thermal diffusivity of the substrate of the network, and ω=2πf the angular frequency of the thermal wave, wherein f is the ordinary frequency in Hz.

According to embodiments, coupling and anti-coupling between oscillators of a network can both be realized depending on the coupling material, the frequency of the thermal wave and the distance between the respective elements.

FIG. 1 shows a network 100 according to an embodiment of the invention. The network 100 comprises a first oscillator 110 and a second oscillator 120. The first oscillator 110 and the second oscillator 120 may be in particular embodied as relaxation oscillators. The first oscillator 110 comprises an oscillation element 111 and the second oscillator 120 an oscillation element 121. The oscillation element 111 and the oscillation element 121 may be in particular elements which comprise a current voltage diagram resembling an s-shape. According to embodiments, the oscillation element 111 and the oscillation element 121 are embodied as self-heating solid-state phase change devices. The solid-state phase change devices comprise a phase change material which has a first phase-state and a second phase state. The first-phase state may be according to embodiments a metallic state and the second phase-state an insulating state. The solid-state phase change material may be e.g. $VO2$, $V4O7$, $V6O11$, $V2O3$, $V6O13$, $V5O9$, $VO$, $V8O15$, $NbO2$, $Ti2O3$, $LaCoO3$, $Ti3O5$, $SmNiO3$, $NdNiO3$, $PrNiO3$ or $Fe3O4$.

The first oscillator 110 comprises a serial resistor or resistive element 112 which is arranged in a serial arrangement to the oscillation element 111. The second oscillator 120 comprises a serial resistor 122 which is arranged in a serial arrangement to the oscillation element 121. The first oscillator 110 may further comprise a capacitor 113 which is arranged in parallel to the serial resistor 112. The second oscillator 120 may further comprise a capacitor 123 which is arranged in parallel to the serial resistor 122. According to embodiments, the capacitor may be in parallel to the oscillation element, so that the oscillation element and the capacitor form a parallel arrangement. Furthermore, in series to this parallel arrangement there may be a resistive element. The first oscillator 110 receives an input voltage Vin1 and the second oscillator 120 receives an input voltage $V_{in2}$. The input voltages $V_{in1}$ and $V_{in2}$ are embodied as DC-voltages.

The network 100 is configured to control the phase of the first oscillator 110 and the second oscillator 120 by thermal coupling through a thermal link 130. The thermal link 130 may be implemented in several different ways according to embodiments. According to some embodiments, the thermal link 130 may be configured such that an antiphase-coupling is achieved between the first oscillator 110 and the second oscillator 120. According to embodiments, the thermal link 130 may be configured such that an in-phase-coupling is achieved between the first oscillator 110 and the second oscillator 120. The respective coupling mode between the first oscillator 110 and the second oscillator 120 may be realized in various ways and depends in particular on the respective coupling materials, the frequency of the thermal wave and the distance between the respective elements involved in the thermal coupling.

The network 100 may be in particular configured as a neural network. According to such an embodiment, the oscillator 110, the oscillator 120 and a plurality of further oscillators may form an oscillating neural network.

Optionally the network 100 may comprise an electrical link 140 for electrically coupling the first oscillator 110 and the second oscillator 120. This is illustrated with a dashed line.

Figure 2:
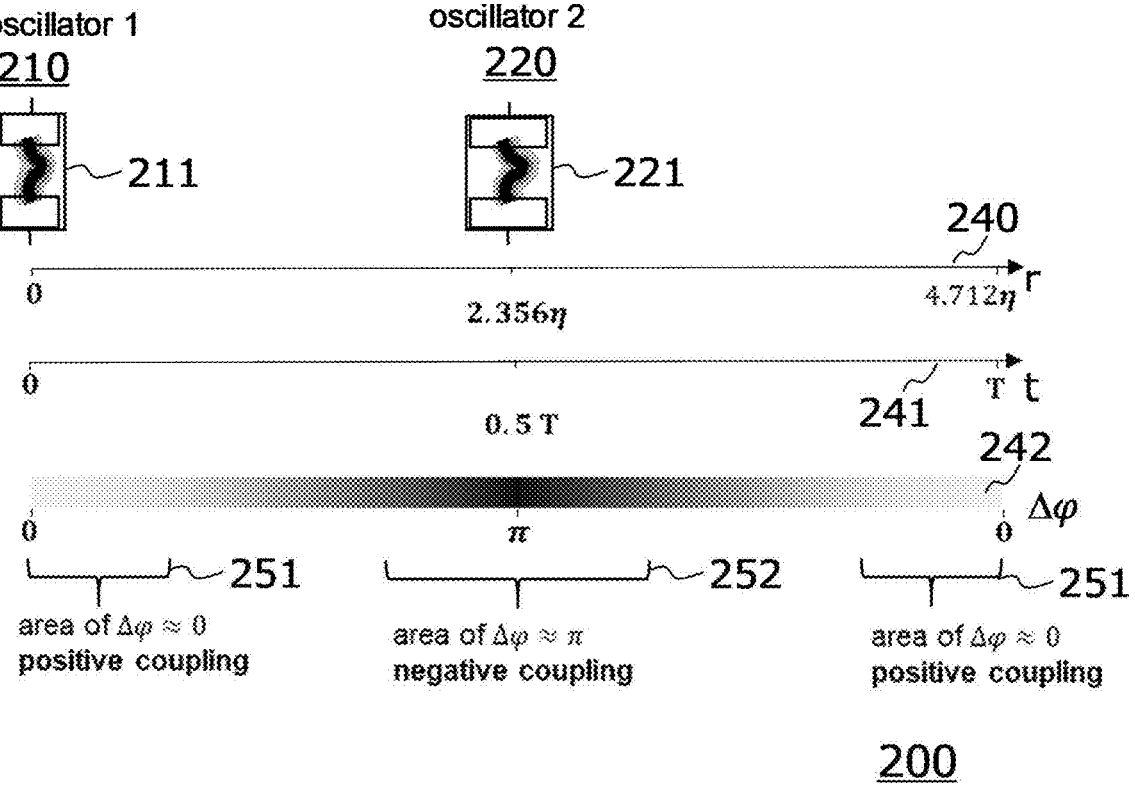
FIG. 2 shows another network according to an embodiment of the invention.

FIG. 2 shows a network 200 according to an embodiment of the invention. The network 200 comprises a first oscillator 210 and a second oscillator 220. The first oscillator 210 and the second oscillator 220 are embodied as relaxation oscillators comprising self-heating solid-state phase change devices. For ease of illustration, only the respective self-heating solid-state phase change devices 211 and 221 of the first oscillator 210 and the second oscillator 220 are shown.

The first oscillator 210 and the second oscillator 220 are arranged in a predefined radial distance r to each other. The respective predefined radial distance r from the first oscillator 210 is illustrated in FIG. 2 with a horizontal axis 240. More particularly, the second oscillator 220 is arranged in a distance d of ~2.356η to the first oscillator 210. This results in thermal negative coupling or in other words in an anti-phase thermal coupling. The thermal coupling may be in particular achieved through thermal substrate-coupling, e.g., the respective thermal wave runs through a common substrate on which the first oscillator 210 and the second oscillator 220 are arranged. According to embodiments, the distance d of ~2.356η, the phase delay of the thermal wave which runs through the substrate will be $\Delta\varphi \approx \pi$, thus enhancing desynchronization between the first oscillator 210 and the second oscillator 220. The respective time $\Delta t$ between peak heat dissipation in the first oscillator 210 (reference) and propagation of heat to the surrounding through the substrate is illustrated in FIG. 2 with a horizontal axis 241 and the corresponding phase delay $\Delta\varphi$ between peak heat dissipation in the first oscillator 210 (reference) and propagation of heat to the surrounding through the substrate is illustrated by a horizontal axis 242. Accordingly, there are areas 251 of positive coupling and areas 252 of negative coupling. According to embodiments, the first oscillator 210 and the second oscillator 220 affect each other bidirectionally, as both send and receive thermal waves to each other. The horizontal axis 242 illustrates the coupling phase with a grey-shading. A black color illustrates a phase delay of $\Delta\varphi = \pi$ and a white color a phase delay of $\Delta\varphi = 0$.

Figure 3:
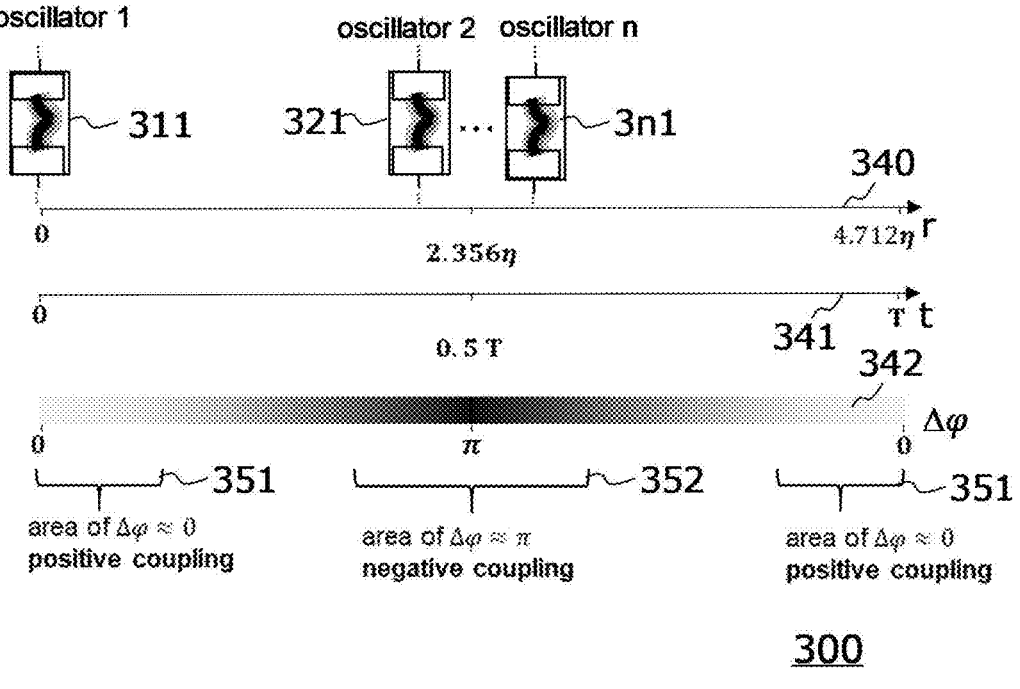
FIG. 3 shows another network according to an embodiment of the invention.

FIG. 3 shows a network 300 according to an embodiment of the invention. According to the embodiment of FIG. 3, several oscillators can be placed within the region of negative coupling of a first oscillator 1. More particularly, the network 300 comprises a plurality n of oscillators denoted as oscillator 1, oscillator 2, . . . , oscillator n. The n oscillators are embodied as relaxation oscillators comprising self-heating solid-state phase change devices. For ease of illustration, only the respective self-heating solid-state phase change devices 311, 321, . . . , 3n1 of the n oscillators are shown.

The oscillator 2 and the further oscillators 3, . . . , n are arranged in a predefined radial distance r to the oscillator 1. This is illustrated with a horizontal axis 340. More particularly, the oscillator 2 and the further oscillators 3, . . . n are each arranged in a radial distance of ~2.356η to the oscillator 1. This results in thermal negative coupling or in other words in an antiphase thermal coupling. At the distance d of ~2.356η, the phase delay of the thermal wave which runs through the substrate will be $\Delta\varphi \approx \pi$, thus enhancing desynchronization between the oscillator 1 and the oscillators 2, 3, . . . n. According to embodiments, in the configuration of FIG. 3 oscillator 1 is coupled negatively with oscillator 2 and with the further oscillators 3, . . . , n while oscillator 2 to oscillator n are coupled positively amongst each other.

The respective time $\Delta t$ between peak heat dissipation in oscillator 1 (reference) and propagation of heat to the surrounding through the substrate is illustrated in FIG. 3 with a horizontal axis 341 and the corresponding phase delay $\Delta\varphi$ between peak heat dissipation in oscillator 1

(reference) and propagation of heat to the surrounding through the substrate is illustrated by a horizontal axis 342. Accordingly, there are areas 351 of positive coupling and areas 352 of negative coupling. The horizontal axis 342 illustrates the coupling phase with a grey-shading. A black color illustrates a phase delay of $\Delta\varphi = \pi$ and a white color a phase delay of $\Delta\varphi = 0$.

Figure 4:
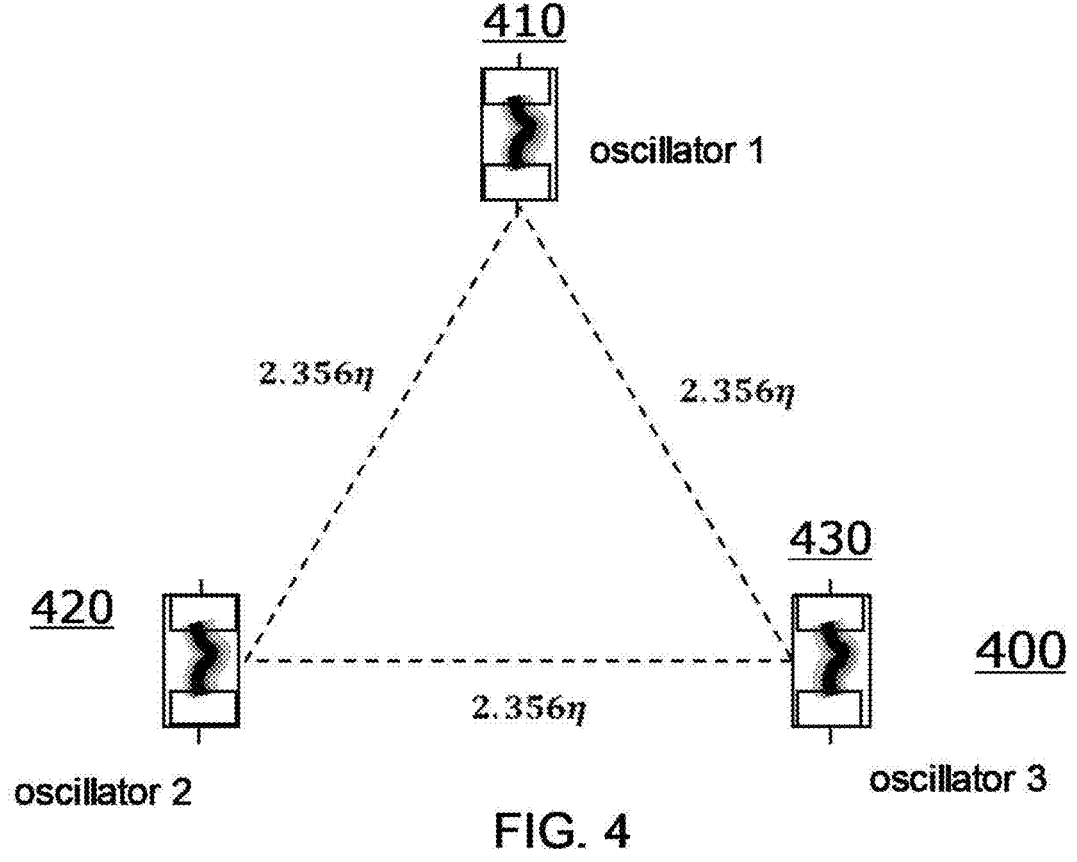
FIG. 4 shows another network according to an embodiment of the invention.

FIG. 4 shows a network 400 according to a further embodiment of the invention. The network 400 comprises three oscillators 410, 420 and 430 in an equilateral triangle configuration. Accordingly, all three oscillators 410, 420 and 430 may be spaced out with distances of ~2.356η. Accordingly, all three oscillators 410, 420 and 430 may be coupled negatively to each other according to embodiments.

Figure 5:
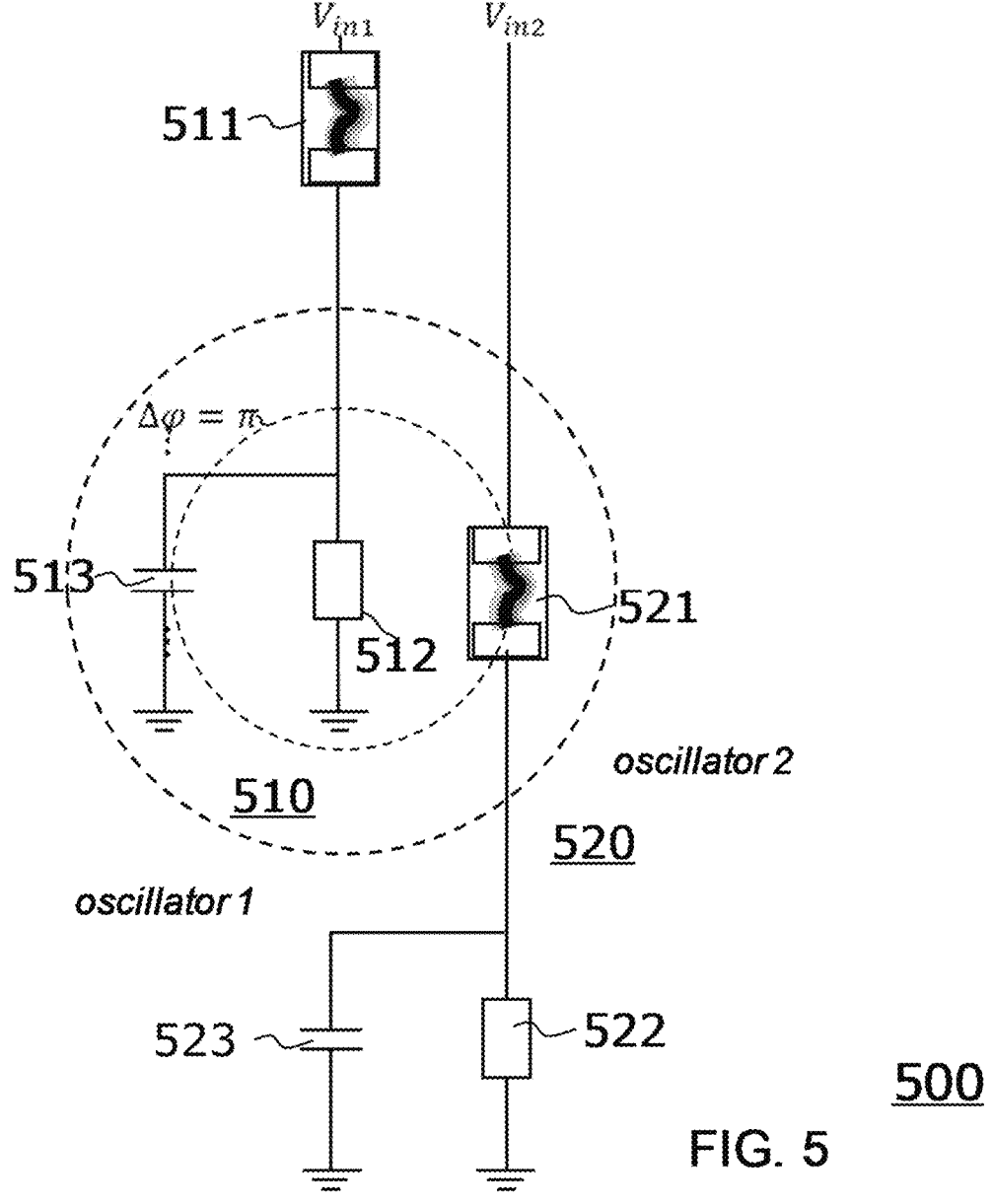
FIG. 5 shows another network according to an embodiment of the invention.

FIG. 5 shows a network 500 according to a further embodiment of the invention. The network 500 comprises a first oscillator 510 and a second oscillator 520. The first oscillator 510 comprises an oscillation element 511 and the second oscillator 520 an oscillation element 521 which may be embodied as self-heating solid-state phase change devices.

The first oscillator 510 comprises a serial resistor 512 which is arranged in a serial arrangement to the oscillation element 511. The second oscillator 520 comprises a serial resistor 522 which is arranged in a serial arrangement to the oscillation element 521. The first oscillator 510 may further comprise a capacitor 513 which is arranged in parallel to the serial resistor 512. The second oscillator 520 may further comprise a capacitor 523 which is arranged in parallel to the serial resistor 522. According to embodiments (not shown), the capacitor may be in parallel to the oscillation element, so that the oscillation element and the capacitor form a parallel arrangement. Furthermore, in series to this parallel arrangement there may be a resistive element.

The first serial resistor 512 is arranged next to or close to the oscillation element 521 and thereby achieves a thermal coupling to the oscillation element 521. The heat dissipated by the serial resistor 512 of oscillator 510 influences oscillator 520, but the serial resistor 512 itself is not influenced by oscillator 520 due to its approximately constant resistance over temperature. Furthermore, oscillation element 511 and oscillation element 521 are placed at a too large distance to be able to impact each other thermally. As a result of such an arrangement, an unidirectional thermal coupling between the first oscillator 510 and the second oscillator 520 may be achieved.

Figure 6:
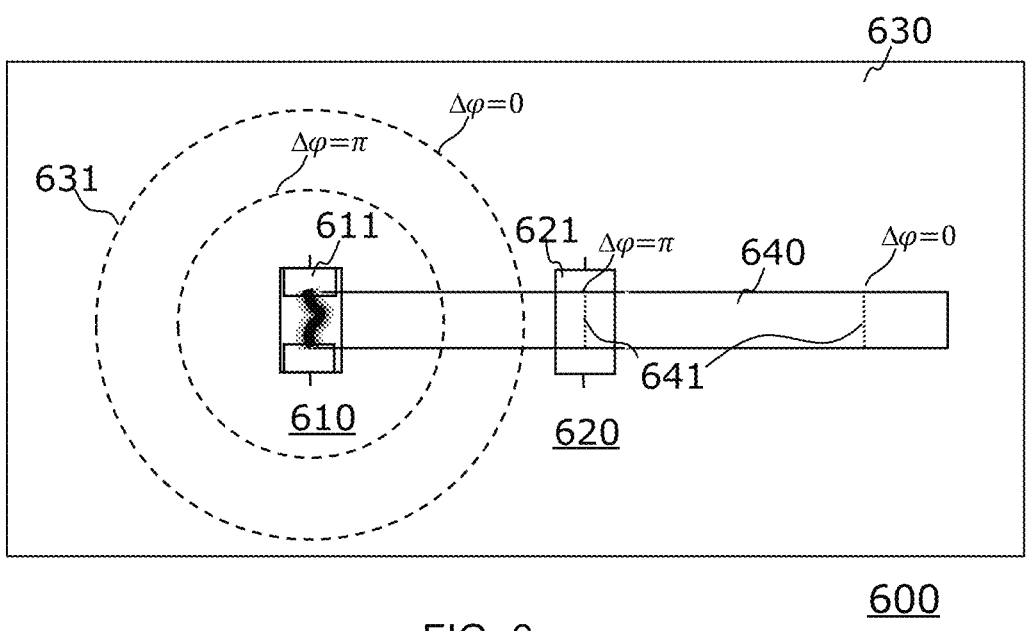
FIG. 6 shows another network according to an embodiment of the invention.

FIG. 6 shows a network 600 according to a further embodiment of the invention. The network 600 comprises a first oscillator 610 and a second oscillator 620. The first oscillator 610 comprises an oscillation element 611 and the second oscillator 620 an oscillation element 621 which may be embodied as self-heating solid-state phase change devices. The first oscillation element 610 and the second oscillation element 621 are illustrated in a simplified form for ease of illustration. The first oscillator 610 and the second oscillator 620 are integrated on a common substrate 630, e.g., a Si-substrate or a III-V-substrate. The network 600 comprises a thermal waveguide 640 between the first oscillator 610 and the second oscillator 620. The thermal waveguide 640 may be integrated in the substrate 630. The thermal wave guide 640 comprises a material which has a thermal diffusivity $\alpha_{th\ waveguide}$ which is different from the thermal diffusivity of the substrate $\alpha_{th\ substrate}$. This can be used to manipulate or adapt the propagation of the thermal wave between the respective oscillation elements of the first oscillator 610 and the second oscillator 620. A corresponding thermal wave which propagates through the substrate is illustrated with a dashed pattern 631, while a corresponding wave which propagates through the thermal waveguide 640 is illustrated with a dotted pattern 641. More particularly, the respective thermal waves 631 and 641 are only illustrated at phases $\Delta\varphi=0$ and $\Delta\varphi=\pi$.

In the example of FIG. 6, the thermal wave guide 640 comprises a material which has a thermal diffusivity $\alpha_{th\ waveguide}>\alpha_{th\ substrate}$. Hence $\eta_{th\ waveguide}>\eta_{Substrate}$.

Accordingly, the wavelength of the thermal wave 641 within the thermal waveguide 640 is longer than the wavelength of the thermal wave 631 within the substrate 630.

Figure 7:
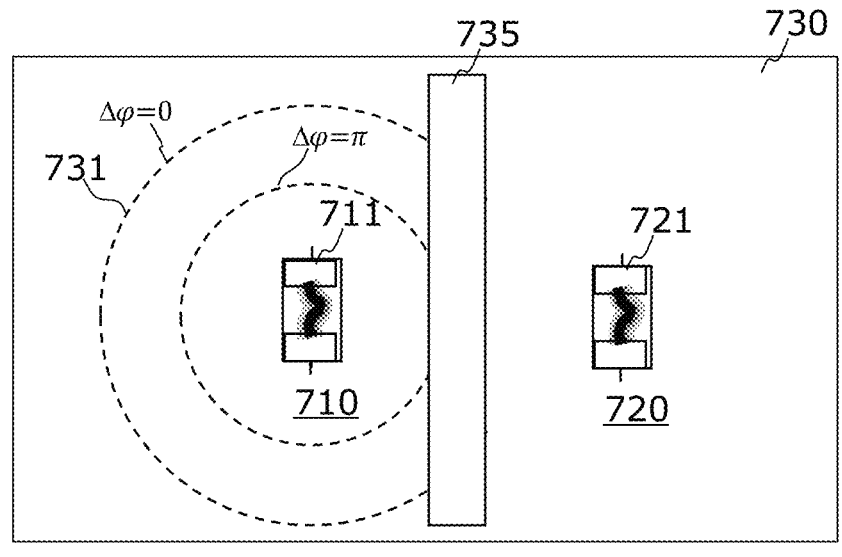
FIG. 7 shows another network according to an embodiment of the invention.

FIG. 7 shows a network 700 according to a further embodiment of the invention. The network 700 comprises a first oscillator 710 and a second oscillator 720. The first oscillator 710 comprises an oscillation element 711 and the second oscillator 720 an oscillation element 721 which may be embodied as self-heating solid-state phase change devices. The first oscillator 710 and the second oscillator 720 are integrated on a common substrate 730, e.g., a Si-substrate or a III-V-substrate. The network 700 comprises as thermal separation structure a trench 735 etched into the substrate 730 of the network. The trench 735 is configured to provide a thermal insulation between the first oscillator 710 and the second oscillator 720. The trench 735 may be filled with a material of a low thermal diffusivity a to inhibit the propagation of thermal waves and achieve non-coupling. This can enable denser packaging, as heat dissipation from outer circuit elements or from parts of the network for which no thermal coupling is desired can also have a parasitic effect and may influence the network in a disruptive way.

A corresponding wave which propagates through the substrate is illustrated with a dashed pattern 731.

According to an embodiment, the coupling strength of a thermal coupling can be manipulated by replacing the coupled series resistor 512 as shown in FIG. 5 which has a fixed resistance by two or more tunable resistors, either in parallel or in series, wherein only one of those is coupled to the second oscillator. Such an arrangement is illustrated with reference to FIG. 8. According to embodiments, the tunable resistors may be implemented or embodied by transistors or memristors or any other element with tunable resistance.

Figure 8:
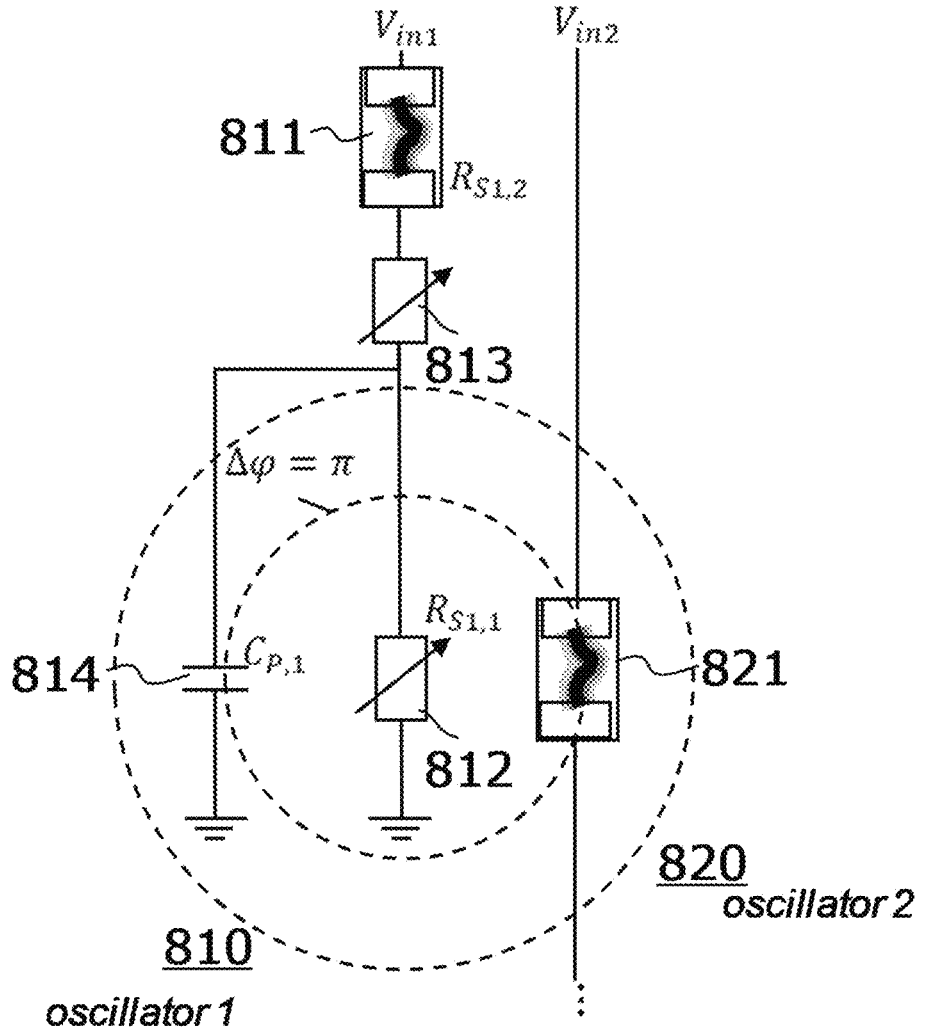
FIG. 8 shows another network according to an embodiment of the invention.

FIG. 8 shows a network 800 according to a further embodiment of the invention. The network 800 comprises a first oscillator 810 and a second oscillator 820. The first oscillator 810 comprises an oscillation element 811 and the second oscillator 820 an oscillation element 821 which may be embodied as self-heating solid-state phase change devices.

The first oscillator 810 comprises a serial resistor 812 and a serial resistor 813 which are arranged in a serial arrangement to the oscillation element 811. The first oscillator 810 may further comprise a capacitor 814 which is arranged in parallel to the serial resistor 812. The serial resistors 812 and 813 are embodied as tunable resistors whose resistance can be tuned.

The serial resistor 812 is arranged next to or close to the oscillation element 821 and thereby achieves a thermal coupling to the oscillation element 821. The heat dissipated by the serial resistor 812 influences oscillator 820, but the serial resistor 812 itself is not influenced by oscillator 820 due to its approximately constant resistance over temperature. Furthermore, oscillation element 811 and oscillation element 821 are placed at a too large distance to be able to impact each other thermally.

In the following it is assumed that resistor 812 has a resistance $R_{S1,1}$ and resistor 813 a resistance $R_{S1,2}$. By adjusting both resistors 812 and 813 simultaneously, it can be achieved that their overall resistance $R_{ges1}$ ($R_{S1,1}$, $R_{S1,2}$) is kept constant and so is the energy dissipated by $R_{ges1}$, thus not changing the electrical properties of the network or circuit, but the energy dissipation in the resistors $R_{S1,1}$ and $R_{S1,2}$ is increased in one and decreased in the other respectively. As only one of the two is coupled to the oscillation element 821, in this example $R_{S1,1}$, the influence of oscillator 810 on oscillator 820 can be tuned. Furthermore, by splitting the series resistance of oscillator 820, $R_{ges2}$, the effect of oscillator 820 on oscillator 810 may be tuned as well (the series resistances of oscillator 820 are not shown in FIG. 8).

According to embodiments, coupling strength configurations as follows may be generally achieved.

Looking at the coupling of two oscillators, one can choose between configurations. For example, one or more of the following: Unidirectional coupling such that oscillator 810 affects oscillator 820; Unidirectional coupling such that oscillator 820 affects oscillator 810; Bidirectional coupling such that oscillator 810 affects oscillator 820 with a first coupling strength a and oscillator 820 affects oscillator 810 with a second coupling strength b; and/or No coupling.

According to embodiments, the series resistance of an oscillator $R_{ges}$ may be split into two resistors $R_{S1,1}$ and $R_{S1,2}$ which are arranged in parallel or in series. The arrangement may be such that one of the two resistors has a different distance to a neighboring oscillating element. The total resistance may be set, while, independently, the ratio between the two resistances can also be varied. This enables to realize a variable thermal coupling.

According to embodiments, the tunable resistors may be implemented by resistance elements comprising transistors or memristors.

FIGS. 9a to 9c illustrates a network 900 configured to perform an adaptive thermal coupling between a first oscillator 910 and a second oscillator 920. The network 900 corresponds to the network 600 as shown in FIG. 6 and comprises the first oscillator 910 and the second oscillator 920. The first oscillator 910 comprises an oscillation element 911 and the second oscillator 920 an oscillation element 921 which may be embodied as self-heating solid-state phase change devices. The second oscillation element 921 is illustrated in a simplified form for ease of illustration. The first oscillator 910 and the second oscillator 920 are integrated on a common substrate 930, e.g., a Si-substrate or a III-V-substrate. The network 900 comprises a thermal waveguide 940 between the first oscillator 910 and the second oscillator 920. The thermal waveguide 940 may be integrated in the substrate 930. The thermal wave guide 940 comprises a material which has a thermal diffusivity $\alpha_{th\ waveguide}$ which is different from the thermal diffusivity of the substrate $\alpha_{th\ substrate}$. A corresponding wave which propagates through the substrate is illustrated with a dashed pattern 931, while a corresponding wave which propagates through the thermal waveguide 940 is illustrated with a dotted pattern 941. More particularly, the respective waves 931 and 941 are only illustrated at phases $\Delta\varphi=0$ and $\Delta\varphi=\pi$.

The first oscillator 910 and the second oscillator 920 are arranged apart from each other at a constant distance d.

The network 900 is configured to perform an adaptive thermal coupling, in particular by adapting the oscillation frequency of one or more of the oscillators of network 900 and thereby changing the respective thermal coupling mode.

More particularly, FIG. 9a shows a negative coupling, FIG. 9b a positive coupling, and FIG. 9c a non-coupling.

The mode of thermal coupling, e.g., positive coupling (driving oscillators into $\Delta\varphi=0$), negative coupling (driving oscillators into $\Delta\varphi=\pi$), or non-coupling (arbitrary phase, amplitude≈0, no interplay between oscillators) is determined by three parameters: distance d between the two oscillators, the effective thermal diffusivity a of material(s) coupling the oscillators and the frequency f of the oscillations. Two of those parameters are usually set during fabrication, namely the distance d and the effective thermal diffusivity a, and hence remain constant during operation of the network. By means of frequency tuning one can change the mode of the thermal coupling from negative to positive by lowering the frequency, and from negative no non-coupling by increasing the frequency of oscillations. According to embodiments, this change of frequency can be achieved through change of the electric circuit parameters within the network, more particularly the electric circuit parameters of the involved oscillators. According to embodiments, the change in frequency can be achieved by locally or globally changing the temperature of the substrate of the respective network or chip.

Referring now to FIG. 9$a$, the negative coupling may be achieved by choosing the distance d such that that $$d = 2.356 \cdot \eta^* = 2.356 \cdot \sqrt{\frac{2a}{\omega^*}},$$

wherein $\omega^*=2\pi f^*$ and $f^*$ being the frequency of the first oscillator 910 for negative coupling which is chosen to be in between the maximum and minimum tunable frequency of the oscillator 910 ($f_{min}<f^*<f_{max}$).

Referring to FIG. 9$b$, the positive coupling may be achieved by choosing the angular frequency $\omega_1$ of the oscillator 910 to be smaller than the corresponding frequency $\omega^*$ of the negative coupling: $\omega1<\omega^*$ Referring to FIG. 9$c$, the non-coupling may be achieved by choosing the angular frequency $\omega_2$ of the oscillator 910 to be greater than the corresponding frequency $\omega^*$ of the negative coupling: $\omega2>\omega^*$ The amplitude of the thermal wave at the second oscillator 920 will hence be very low.

According to embodiments, instead of operating two oscillators at the same frequency, the oscillators may also be coupled at different or the same harmonics (integer multiples of frequency f).

Figure 10:
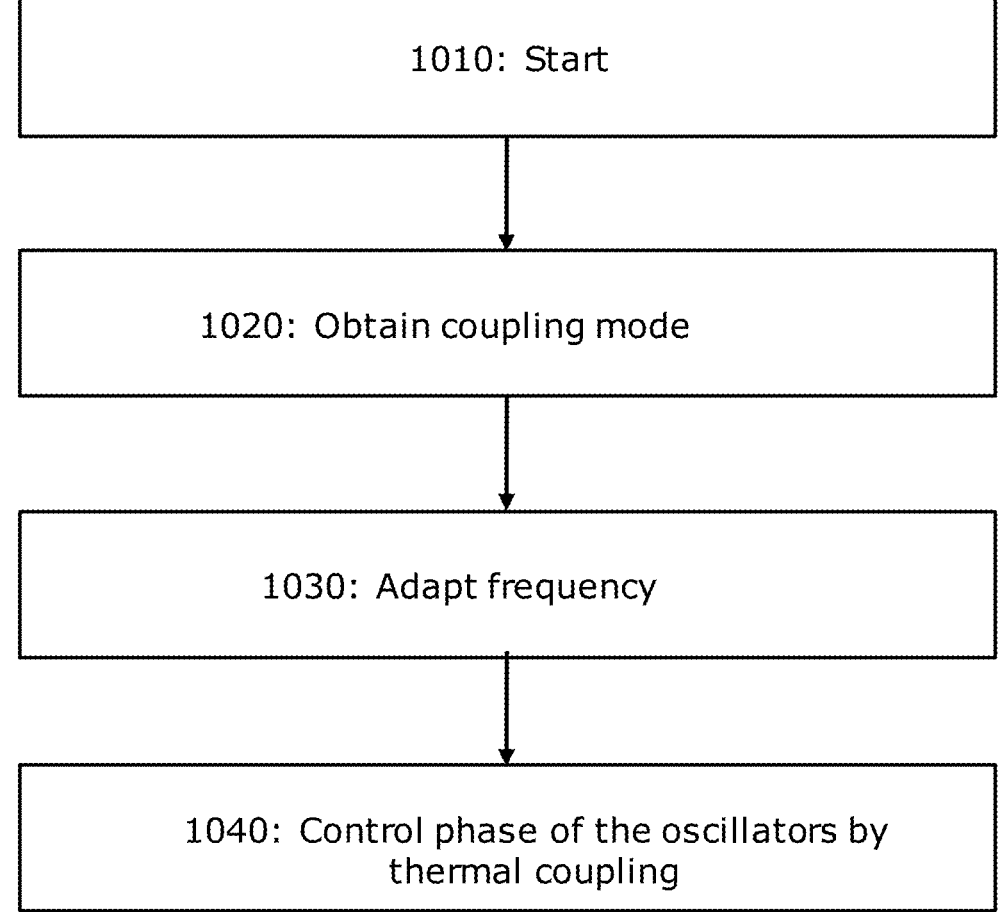
FIG. 10 shows a flow chart of method steps of a method according to an embodiment of the invention.

FIG. 10 illustrates method steps of a method according to an embodiment of the invention. For the method steps, it is referred in particular to the network 900 of FIG. 9.

At a step 1010, the method starts.

At a step 1020, control logic of the network 900 checks in which coupling mode it shall be operated and obtains the desired coupling mode.

At a step 1030, the frequency of the respective oscillators is adapted in order to operate in the desired coupling mode.

Then, at a step 1040, the network 900 controls the phase of the oscillators by thermal coupling through a thermal link.

The present invention may be a system, a method, and/or a computer program product. The computer program product may include a computer readable storage medium (or media) having computer readable program instructions thereon for causing a processor to carry out aspects of the present invention.

The invention may be in particular embodied as a computer program product for operating a network, e.g., the networks 100-900 as described above.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A network comprising:
   a first plurality of oscillators, wherein the network controls a phase of the first plurality of oscillators by thermal coupling through a thermal link, and wherein one or more thermal separation structures are etched into a substrate of the network and separate the first plurality of oscillators from a second plurality of oscillators.

2. The network according to claim 1, wherein the thermal coupling comprises antiphase coupling.

3. The network according to claim 1, wherein the thermal coupling comprises in-phase coupling.

4. The network according to claim 1, wherein the network comprises a plurality of electrical links for electrically coupling the plurality of oscillators.

5. The network according to claim 1, wherein:
   the network is a neural network; and
   the plurality of oscillators form an oscillating neural network.

6. The network according to claim 1, wherein the plurality of oscillators comprises a first oscillator and a second oscillator, wherein the second oscillator is arranged within an antiphase coupling region of the first oscillator.

7. The network according to claim 1, wherein the plurality of oscillators comprises a first, a second and a third oscillator, wherein the first, the second and the third oscillator are all arranged within an antiphase coupling region with respect to each other.

8. The network according to claim 1, wherein each oscillator of the plurality of oscillators is embodied as a relaxation oscillator.

9. The network according to claim 1, wherein each oscillator of the plurality of oscillators comprises a self-heating solid-state phase change device, the self-heating solid-state phase change device comprising a phase change material having a first phase-state and a second phase-state.

10. The network according to claim 9, wherein the first phase-state is a low resistance state and the second phase-state is a high resistance state.

11. The network according to claim 9, wherein the phase change material is selected from the group consisting of $VO_2$, $V_4O_7$, $V_6O_{11}$, $V_2O_3$, $V_6O_{13}$, $V_5O_9$, $VO$, $V_8O_{15}$, $NbO_2$, $Ti_2O_3$, $LaCoO_3$, $Ti_3O_5$, $SmNiO_3$, $NdNiO_3$, $PrNiO_3$ and $Fe_3O_4$.

12. The network according to claim 9, wherein the plurality of oscillators comprises a first oscillator comprising a first serial arrangement of a first self-heating phase change device and a first serial resistor and second oscillator comprising a second serial arrangement of a second self-heating phase change device and a second serial resistor, wherein the first serial resistor is thermally coupled to the second self-heating phase change device, thereby achieving an unidirectional thermal coupling between the first oscillator and the second oscillator.

13. The network according to claim 1, further comprising one or more thermal waveguides for facilitating the thermal coupling.

14. The network according to claim 1, wherein the one or more thermal separation structures provide a thermal insulation between two or more oscillators of the plurality of oscillators.

15. The network according to claim 1, wherein the network is configured to perform an adaptive thermal coupling between the two or more oscillators of the plurality of oscillators by adapting an oscillation frequency of one or more oscillators of the plurality of oscillators, thereby changing a thermal coupling mode.

16. The network according to claim 15, wherein adapting the oscillation frequency comprises changing one or more parameters of electric components of the network.

17. The network according to claim 15, wherein adapting the oscillation frequency comprises changing a local or global temperature of a substrate of the network.

18. The network according to claim 1, wherein one or more oscillators of the plurality of oscillators comprise two or more tunable resistors, wherein only one of the two or more tunable resistors is thermally coupled to another oscillator of the plurality of oscillators.

19. A method for running a network comprising a first plurality of oscillators, the method comprising:
  controlling a phase of the first plurality of oscillators by thermal coupling through a thermal link, and wherein one or more thermal separation structures are etched into a substrate of the network and separate the first plurality of oscillators from a second plurality of oscillators.

20. A computer program product for operating a network, the network comprising a first plurality of oscillators and a plurality of thermal links, said computer program product comprising:
  a computer readable storage medium having program instructions embodied therewith, the program instructions executable by the network to perform a method comprising:
    controlling a phase of the first plurality of oscillators by thermal coupling through the plurality of thermal links, and wherein one or more thermal separation structures are etched into a substrate of the network and separate the first plurality of oscillators from a second plurality of oscillators.

* * * * *